Figure 1:
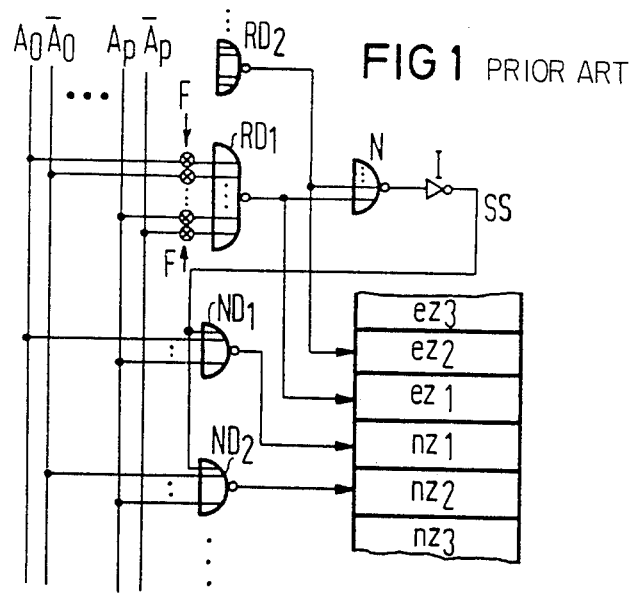

United States Patent [19]
Wawersig et al.

[11] Patent Number: 4,737,935
[45] Date of Patent: Apr. 12, 1988

[54] INTEGRATED WRITE/READ MEMORY

[75] Inventors: Jürgen Wawersig; Dieter Kantz, both of Munich, Fed. Rep. of Germany

[73] Assignee: Siemens Aktiengesellschaft, Berlin and Munich, Fed. Rep. of Germany

[21] Appl. No.: 759,042

[22] Filed: Jul. 25, 1985

[30] Foreign Application Priority Data

Aug. 2, 1984 [DE] Fed. Rep. of Germany ....... 3428552

[51] Int. Cl.$^4$ ............................................... G11C 7/00
[52] U.S. Cl. ....................................... 365/200; 371/10
[58] Field of Search ........................... 365/200; 371/10

[56] References Cited

U.S. PATENT DOCUMENTS

| 4,358,833 | 11/1982 | Folmsbee et al. | 365/200 |
| 4,441,170 | 4/1984 | Folmsbee et al. | 365/200 |

OTHER PUBLICATIONS

Kim Kokkonen et al., "Redundency Techniques for Fast Static RAMs", 1981 IEEE International Solid-State Circuits Conference, Digest of Technical Papers, Feb. 18, 1981, pp. 80-81.

S. Sheffield Eaton et al., "A 100ns 64K Dynamic RAM Using Redundancy Techniques", 1981 IEEE International Solid-State Circuits Conference, Digest of Technical Papers, Fed. 18, 1981, pp. 84-85.

*Primary Examiner*—Joseph A. Popek
*Attorney, Agent, or Firm*—Herbert L. Lerner; Laurence A. Greenberg

[57] ABSTRACT

An integrated write/read memory consisting of a matrix of normal memory cells organized in rows and columns. The memory further includes a smaller matrix of redundant memory cells having their own column and row address decoders that can be engaged to replace any faulty memory cells in the normal matrix. The redundant address decoders are connected to all the address lines by means of fusible links so that any redundant address gate can be programmed to emulate the address of a faulty memory cell. The system further includes logic controls that automatically disables any normal memory address if a redundant memory cell is programmed to take its place.

12 Claims, 7 Drawing Sheets

INTEGRATED WRITE/READ MEMORY

The invention relates to an integrated write/read memory with storage cells arranged in matrix-fashion in columns and rows, in which the addressing of the storage cells is accomplished via address decoders respectively assigned to a column or row, wherein a predetermined number of columns and rows are provided for normal operation and a remaining number of columns and rows are provided as replacement for a respective column or row of the columns or rows provided for normal operation, in which redundant decoders assigned to the individual columns and rows provided as replacement are designed and are adapted to the normal decoder provided for normal operation in such a manner that addressing each of the columns and rows provided as replacement is possible only after a permanent change which includes severing a connection F at the redundant decoder respectively assigned to them, and in addition, this change is connected with a deactivation of the normal decoder respectively assigned to the associated normal decoder.

Write/read memories of the above-mentioned type are generally known and are described, for instance in "1981 IEEE International Solid-State Circuits Conference", Pages 80, 81, 84 and 85, wherein the subject is dynamic write/read memories, the individual storage cells of which are designed as single-transistor storage cells.

In write/read memories equipped with redundancy, the possibility is provided to electrically deactivate column or row lines leading to defective storage cells of the memory matrix, i.e. to make them inoperable and to activate an identical redundant matrix line instead. This is done as a rule by cutting conducting connections (fusible link) which makes the address decoder address the redundant matrix line, which, however, is not addressed in the not cut open condition. This is achieved by the separation, due to appropriate design of a redundancy decoder belonging to the redundant matrix line, in the part of the memory matrix provided for normal operation, so that the replaced column or row is addressed, instead by the newly activated corresponding redundant matrix line. The manner in which this is achieved conventionally is explained below in the description of the drawings.

It is understandable that the amount of circuitry required for the deactivation of a defective matrix line and the activation of the replacement line and therefore, of chip area, should be as small as possible. In addition, it is desirable that these measures are accompanied, in the operation of the memory, by a time delay as short as possible. Finally, the operation of the memory should suffer no loss of reliability.

It is accordingly an object of the invention to provide an integrated write/read memory which overcomes the herein-afore mentioned disadvantages of the heretofore-known devices of this general type.

With the foregoing and other objects in view, there is provided, in accordance with the invention, an integrated write/read memory with storage cells arranged in matrix-fashion in columns and rows, in which the addressing of the storage cells is accomplished via address decoders respectively assigned to a column or row, wherein a predetermined number of columns and rows are provided for normal operation and a remaining number of columns and rows are provided as replacement for a respective column or row of the columns or rows provided for normal operation, the memory which comprises redundant decoders assigned to the individual columns and rows provided as replacement are designed and are adapted to the normal decoder provided for normal operation in such a manner that addressing each of the columns and rows provided as replacement is possible only after a permanent change which includes severing a connection F at the redundant decoder respectively assigned to them, and in addition, this change is connected with a deactivation of the normal decoder respectively assigned to the associated normal decoder; the normal decoders assigned to the columns or rows for normal operation being designed so that a selection of one of the normal decoders is accomplished, if the redundant decoder is not addressed simultaneously by an appropriate combination of address lines and a first activating signal common to all normal decoders is produced; the redundant decoders being equipped in such a manner that a selection of one of these redundant decoders for replacing one of the columns or rows provided for normal operation is accomplished by the combination of address lines corresponding to the normal decoder to be replaced, and a second activating signal common to all redundant decoders is produced; that with the execution of the permanent change at one or several redundant decoders and in case of a selection of one of these redundant decoders, an inhibit signal is generated which serves the purpose of preventing the level change required for the normal decoder of the first activation signal.

In accordance with another feature of the invention there is provided at least one NOR-gate associated with each of the normal decoders as well as each of the redundant decoders wherein, in the case of the normal decoder, a corresponding combination of address lines forms signal inputs for the NOR gates; wherein, in the case of the redundant decoder, all address lines form signal inputs for the NOR gates; each of these signal inputs of each NOR gate of the redundant decoders being connected to the respective address line via a disconnectible connection; the outputs of the NOR gates of the normal decoders being provided for controlling a respective first AND gate; the outputs of the NOR gates of the redundant decoders being provided for controlling a respective second AND gate; the first and second AND gates simultaneously being controlled by a respective one of the first and second activating signals and in turn serving for releasing a connection between a respective data input or data output and of the rows or columns belonging to the respective normal decoder or redundant decoder; the NOR gate of each individual redundant decoder together with a common clock signal common to all redundant decoders operating to control a third AND-gate, the output signal of which has an inhibit signal, and controls the first activating signal required for the release of the connection between the data input and the data output and the columns or rows associated with the normal decoders for deactivation of the first activating signal.

In accordance with an additional feature of the invention, the first, second and third AND gates provided in the normal decoders and in the redundant decoders each have two signal inputs, wherein the one signal input is addressed by the output of the NOR gate acted upon by the address lines and the other input of the first and second AND gates is acted upon, in the case of the normal decoder by the first activating signal common to all normal decoders and in the case of the redundant decoders by the second activating signal common to all redundant decoders; the third AND gate provided in the case of the individual redundant decoders is acted upon at its second input by the common clock signal; a signal is available at the output of the third AND gate, which is generated after the respective redundant decoder is programmed to a selected address, then generated due the selected address, which, through a further OR gate common to all redundant decoders and which is driven from the outputs of all third AND gates of the redundant decoders from the input side, whereby the inhibit signal is generated at the output of this further OR gate.

In accordance with an added feature of the invention, the inhibit signal generated at the output of the further OR gate is fed through an inverter to an input of a fourth AND gate; and another input of this fourth AND gate is driven by the common clock signal, whereby the first activation signal is generated at the output of the fourth AND gate which serves for activating the first AND gate and is common for all normal decoders. In accordance with a further feature of the invention, in the individual redundant decoders there is assigned to each address input a self-locking MOS-field effect transistor which forms a switching transistor for the NOR gate of the respective redundant decoder and the drain of which is connected via a disconnectible connection to the source terminal of a common load transistor and thereby to an output of the NOR gate formed by the self-locking transistors: and furthermore the output of the NOR gate is connected via a transfer transistor connected at its gate to the supply potential of the NOR gate to the gates of two further third and fourth transistors, the source terminal of which is respectively connected via a respective first and second protective flip-flop, to the reference potential of the NOR gate, and the drain terminal of the fourth transistor, which is acted upon by the common second activating signal of the redundant decoder, and in the case of the third transistor by the common clock signal provided in common for the simultaneous control of the third AND gate in the redundant decoders, while the source of the fourth transistor acted upon at its drain by the second activating signal forms the release of the connection between the data input or the data output and the output of the respective redundant decoder, while the third transistor which represents the third AND gate of the redundant decoder and is controlled by the common clock signal produces at its source terminal the inhibit signal causing the deactivation of the first activating signal after a corresponding redundant decoder is selected.

In accordance with again another feature of the invention, the first and second protective flip-flops are connected at one respective first node directly to the source terminal of the two respective first and second transistors each forming a respective AND gate with a respective protective flip-flop, the base points of each flip-flop being connected to reference potential for the NOR gate forming the redundant decoder, while a second node of each of the two protective flip-flops are connected to supply potential of the redundant decoder via an MOS field effect transistor connected as a resistor.

In accordance with again an additional feature of the invention, for generating the second activating signal serving jointly the redundant decoders, a circuit consisting of twelve self-blocking MOS-field effect transistors numbered one to twelve and a capacitor are provided as well as for their operation a first and a common clock signal; the first numbered transistor is connected with its source to reference potential, with its gate to the first clock signal and with its drain to supply potential via a second numbered transistor controlled by the common clock signal as well as to the gate of a third numbered transistor; the third numbered transistor, together with a fourth numbered transistor forms a further series circuit located between the supply potential and reference potential, in which the fourth numbered transistor connected with its drain to the supply potential is controlled by the first clock signal; a circuit point located between the third and the fourth numbered transistor is connected via the source-drain path of a fifth numbered transistor the gate which is controlled by the common clock signal to the gate of a sixth numbered transistor addressed at its drain by the common clock signal as well as via a twelfth numbered transistor which is controlled by the first clock signal to supply potential; the source terminal of the sixth numbered transistor is connected at the one side to the gate of a seventh numbered transistor, the drain of which is connected to supply potential, and the source of which is connected to its own gate via the capacitor and to the drain of a ninth numbered transistor, the source of which is connected to reference potential, and the gate of which is in turn connected to the circuit point between the third and fourth numbered transistor; the source terminal of the sixth numbered transistor is connected to the drain terminal of a tenth numbered transistor, which is controlled by the first clock signal and connected at its source to reference potential; the source terminal of the sixth numbered transistor is connected to the gate of an eighth numbered transistor, the drain of which is connected to supply potential and the source of which forms the output furnishing the second activating signal for the redundant decoder as well as, via a further eleventh numbered transistor to reference potential, where the gate of the eleventh numbered transistor is acted upon by the circuit point located between the third and the fourth transistor, and in which, finally, the first and the common clock signals are applied in such a manner that the falling edge of the first clock signal is located in time immediately before the appearance of the addressing signals, while the common clock signal is used for the corresponding control of the third AND gate in the individual redundant decoders.

In accordance with again a further feature of the invention, the inhibit signal furnished by an activated redundant decoder, together with the first and the common clock signal is provided for controlling a circuit which furnishes the first activating signal for the normal decoders and is formed by self-blocking MOS-field-effect transistors numbered 14 to 27, as well as a further capacitor; this circuit is designed in such a way that, with the appearance of the inhibit signal, the generation of the first activating signal is suppressed if, simultaneously with the addressing of the redundant decoder causing the generation of the inhibit signal, a normal decoder is being addressed.

In accordance with still another feature of the invention, the circuit formed by the self-locking MOS-field effect transistors numbered 14 to 27 of the same channel type is designed in such a manner that a first inverter, formed by a switching transistor controlled by the first clock signal and a fifteenth numbered load transistor controlled by the common clock signal controls with its output the sixteenth numbered switching transistor of a second inverter, the seventeenth numbered load transistor of which is controlled at its gate by the first clock signal; the output of the second inverter is connected via the source-drain path of an eighteenth numbered transfer transistor controlled by the common clock signal is connected, at the one side, to the gate of a nineteenth numbered transistor which is driven at its drain by the common clock signal and is connected, at the other side, via the source-drain path of a twentieth numbered discharge transistor controlled by the inhibit signal referenced to reference potential; the nineteenth numbered transistor driven at its gate by the output of the second inverter is connected with its source to the one side, via a parallel circuit consisting of a twentyfirst numbered transistor controlled by the inhibit signal, to a twentysecond numbered transistor controlled by the first clock signal referenced to reference potential and to the other side, to the one terminal of the further capacitor as well as to the gates of charging twentythird and twentyfourth numbered transistors which are connected with their respective drain to supply potential; the other terminal of the further capacitor is connected to the source of a twentyfifth numbered transistor connected with its drain to reference potential; the twentyfifth numbered transistor is controlled at its gate by the output of the second inverter; the source of the twentyfourth numbered charging transistor is connected via the parallel circuit consisting of two twentysixth and twentyseventh numbered transistors in series with the reference potential, wherein the twentyseventh numbered transistor is controlled by the inhibit signal and the twentysixth numbered transistor by the output of the second inverter; the first activating signal for the normal decoder is generated at a circuit point which is located between the drain terminals of the two twentysixth and twentyseventh numbered two transistors and the source terminal of the twentyfourth numbered charging transistor.

In accordance with still an additional feature of the invention, for obtaining the release of the connection between the data input and the data output, respectively, of the normal matrix rows provided for normal operation, a circuit is used which is constructed as follows:

(a) a number p of transistors wherein p=number of pairs of addressing lines is connected in parallel in a normal decoder in a manner of an NOR gate, where each of the transistors is addressed by one of the addressing lines; wherein the source terminals of all of these transistors are connected to reference potential and wherein the drain terminals of all of these transistors are connected to a circuit point A', (b) wherein this circuit point A' is connected via the sourcedrain path of a further transistor to supply potential, wherein control of the gate of this further transistor by the first clock signal causes a pre-charging of circuit point A' to supply potential, (c) wherein circuit point A' is furthermore connected via the source-drain path of a shunt transistor having its gate connected to supply potential, to the gate of a switching transistor, (d) wherein the switching transistor is controlled at its drain terminal by the first activating signal; is connected at its source terminal to one side to the gate terminal of two transfer transistors which when activated at their respective gates cause the release of the connection between the data input and data output, respectively, of the normal matrix rows provided for normal operation; to the other side connected to the drain of the first transistor of the protective third flip-flop containing two cross-coupled transistors and the gate of the other transistor of the third protective flip-flop;

(e) wherein the other transistor of the third protective flip-flop is connected with its source terminal to the gate of the first transistor of the third protective flip-flop as well as, via the source-drain path of a load transistor to supply potential wherein the gate of this load transistor also is connected to supply potential, and (f) wherein the source terminals of the two transistors which form the third protective flip-flop, are connected to reference potential.

In accordance with still an added feature of the invention, a subdivision of the normal matrix columns and rows provided for normal operation into a left and a right cell-field part with a design of the corresponding normal decoders in the manner of center decoders which are connected with the left or right cell-field parts, respectively, via a left or right switch, respectively, wherein the left and right switches, respectively, are each addressed via a left or right activating signal, respectively, characterized thereby that the redundant matrix columns and rows provided as replacement are also subdivided into a left row half part and a right row half part; these row half parts being selected via a left or right redundant decoder of its own; and wherein the left or right activating signal is generated analogously with the first activating signal for normal decoders.

In accordance with yet a further feature of the invention, a corresponding left and right inhibit signal is used for generating the left or right activating signal which is generated analogously by the left or right redundant decoders to form the inhibit signal, which optionally suppresses the occurrence of the first activating signal in normal decoders.

In accordance with a concomitant feature of the invention, there is provided:

(a) a plurality of center decoders which each contain a corresponding plurality of NOR gates, each NOR gate which is realized in the form of p parallel-connected MOS transistors wherein p=number of pairs of address lines including their complementary address lines and wherein each gate of the MOS transistors is controlled by an addressing line or a complementary addressing line; wherein the source terminals of the MOS transistors are connected to reference potential and a circuit point, formed by the common connection of the drain terminals of all parallel-connected MOS transistors of the NOR gate, via the source-drain path of the switching transistor controlled by the first clock signal referenced to supply potential; and (b) switches disposed to the left or right of each center decoder, including a left and a right transverse transistor and respectively having its gate connected to supply potential and wherein source and drain, respectively, is connected at the one side, to the circuit point of the center decoder and, at the other side, connected to the gate terminal of a respective further left and right switching transistor, wherein the left or right activating signal is connected to the drain of the left and right switching transistor and wherein the source terminal forms a respective left or right circuit node which is connected, respectively, to the left or right cell-field half part at the gates of respective left and right pairs of transfer transistors which cause the release of the connection between the data input and the data output and of the respective left or right row half parts provided for normal operation; and wherein this circuit node to the other side is connected to respective third protective flip-flops, formed in the usual manner of two cross-coupled transistors in such a manner that the left and right circuit node, respectively, forms the drain terminal of cross-coupled transistors as well as also the gate terminal of the other cross-coupled transistor, and wherein the source terminals of the two transistors are connected to reference potential and the gate terminal of the one transistor as well as the drain terminal of the other transistor are connected to supply potential via a further respective load transistor connected as a resistor.

Other features which are considered as characteristic for the invention are set forth in the appended claims.

Although the invention is illustrated and described herein as embodied in an integrated write/read memory, it is nevertheless not intended to be limited to the details shown, since various modifications and structural changes may be made therein without departing from the spirit of the invention and within the scope and range of equivalents of the claims.

Figure 2:
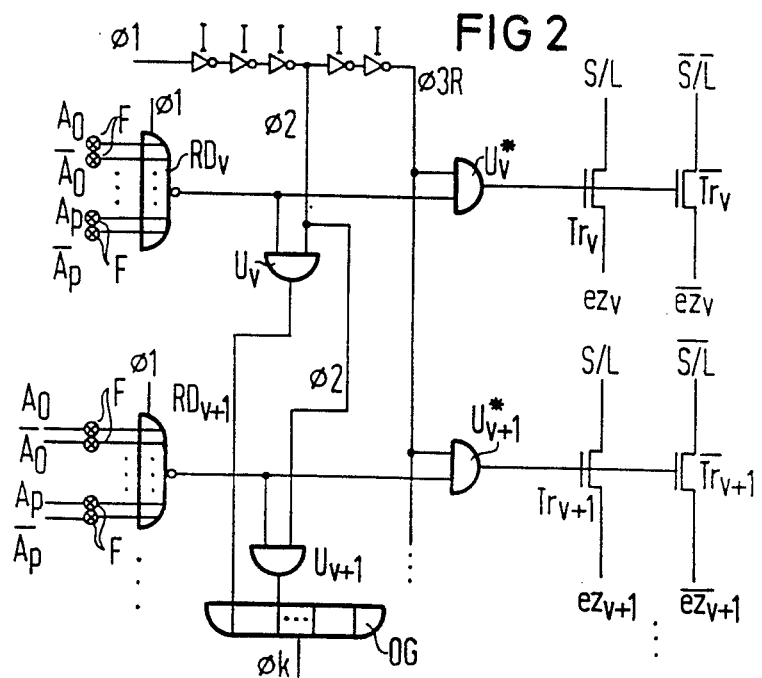
Figure 2A:
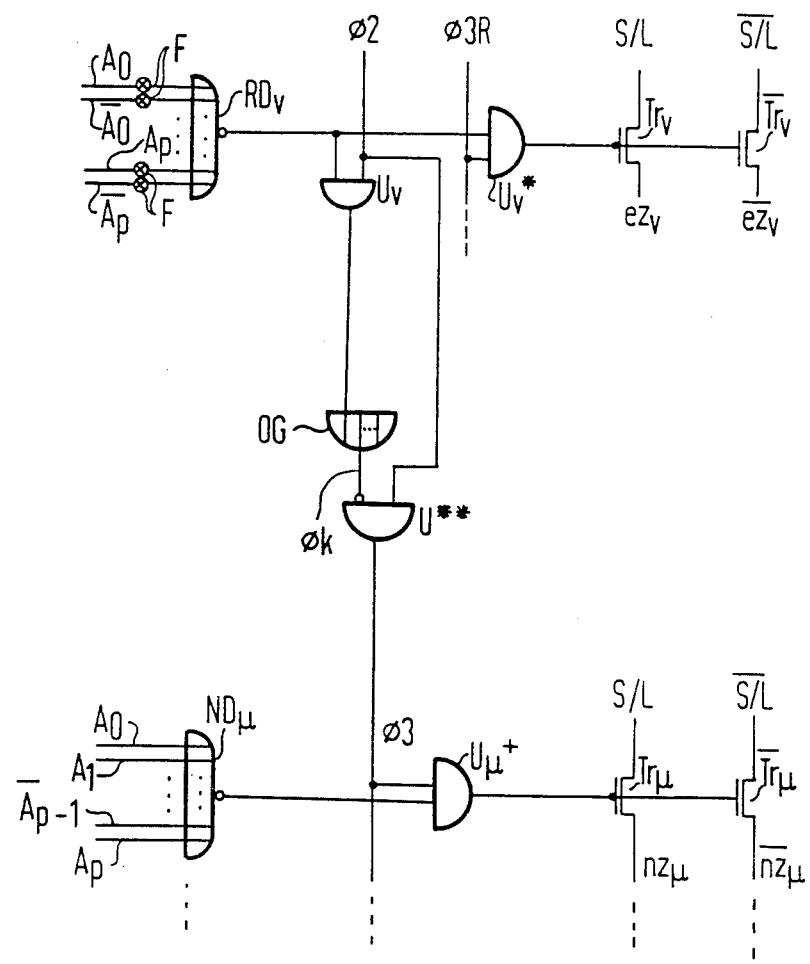
Figure 3:
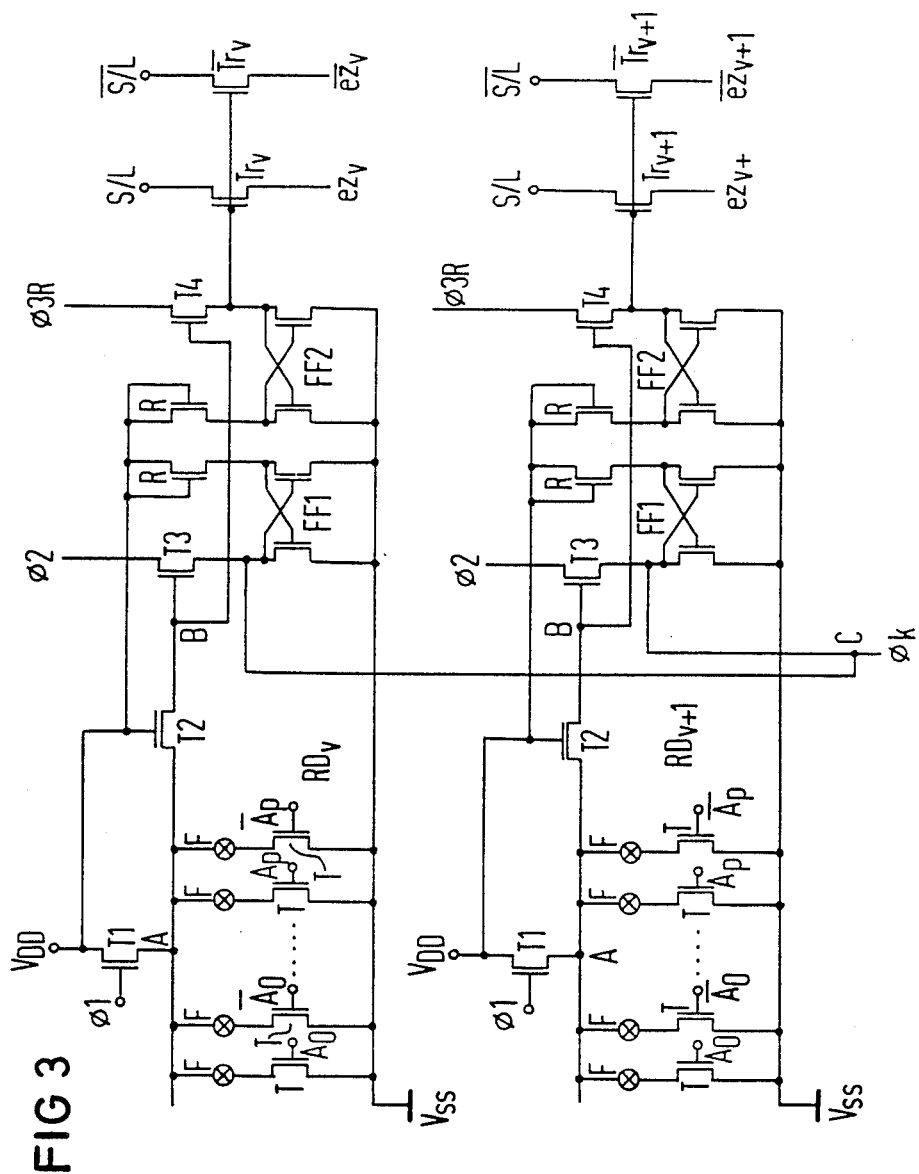
Figure 3A:
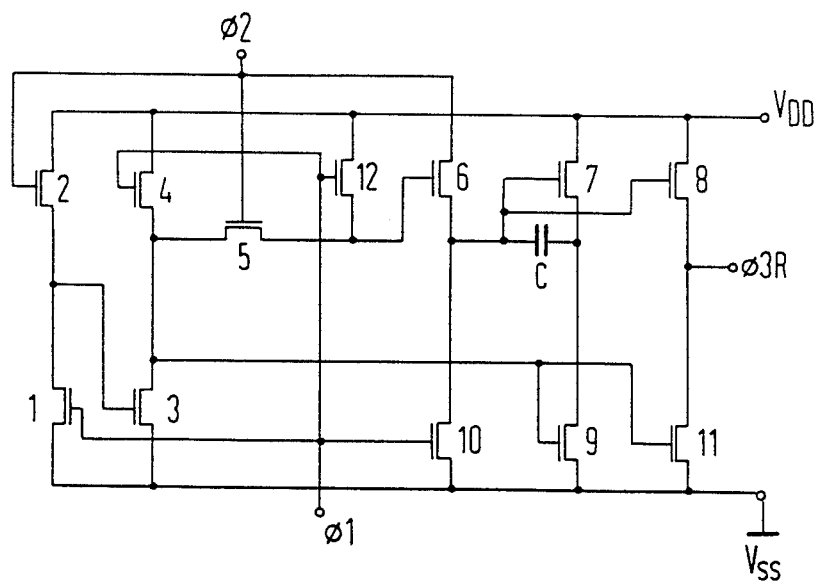
Figure 3C:
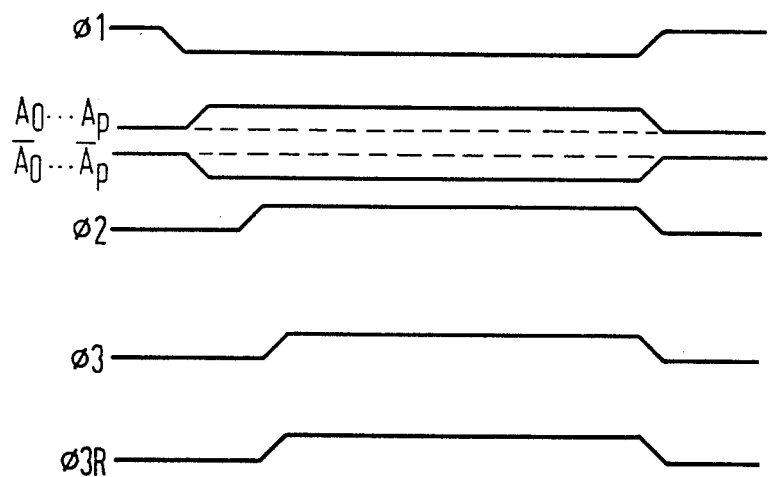
Figure 3B:
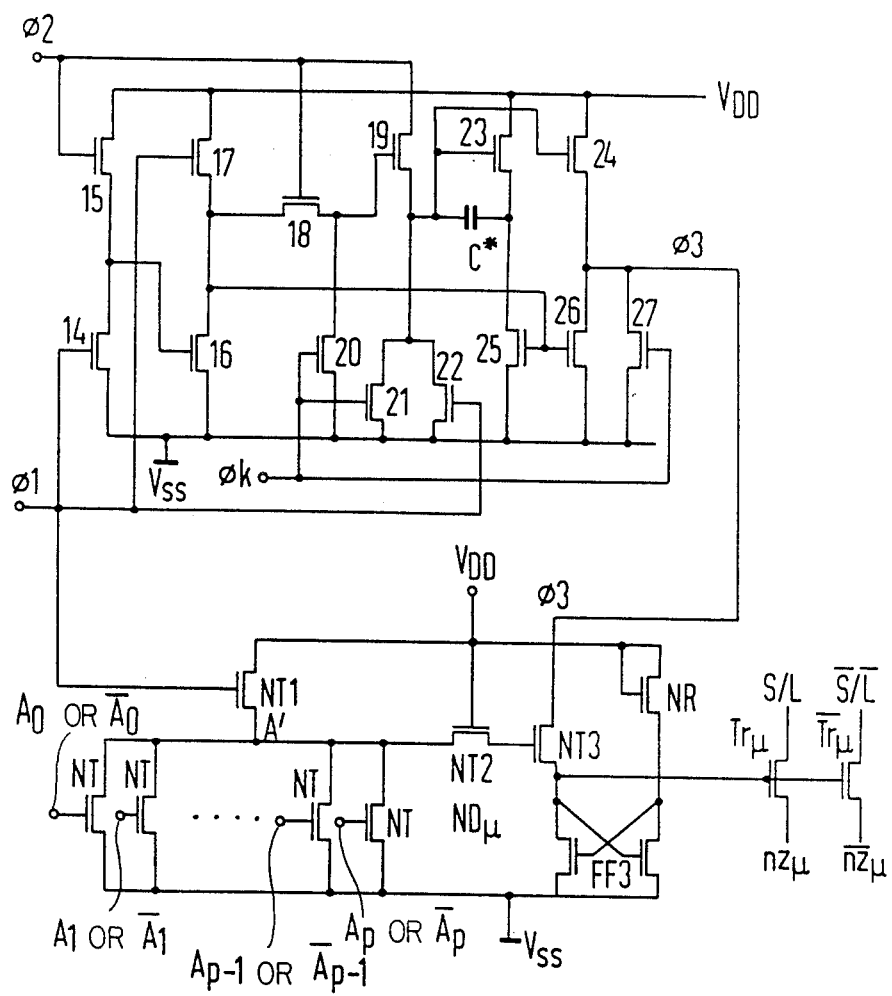
Figure 4A:
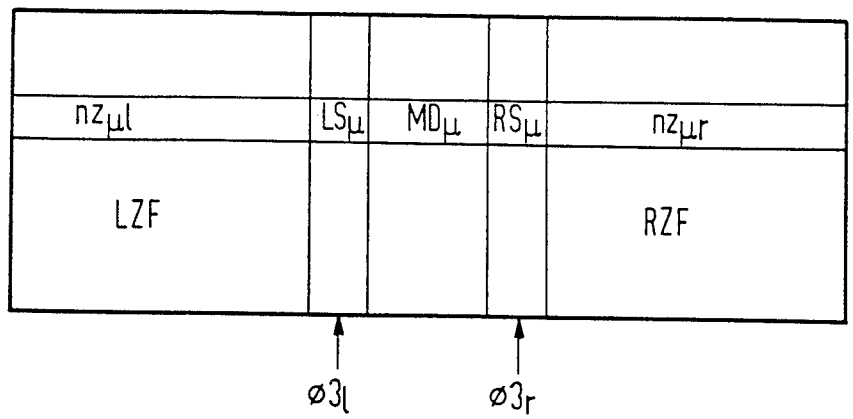
Figure 4B:
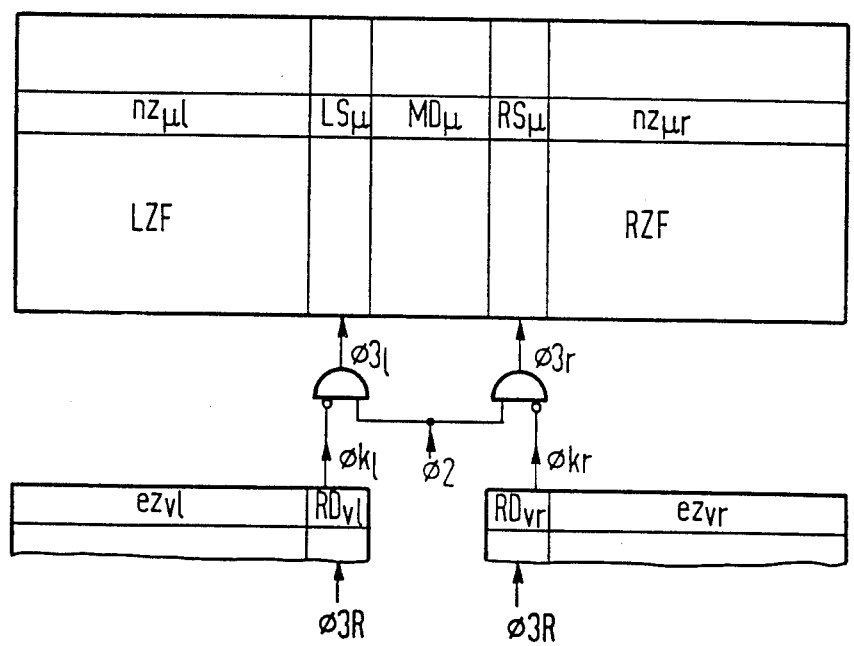
Figure 5:
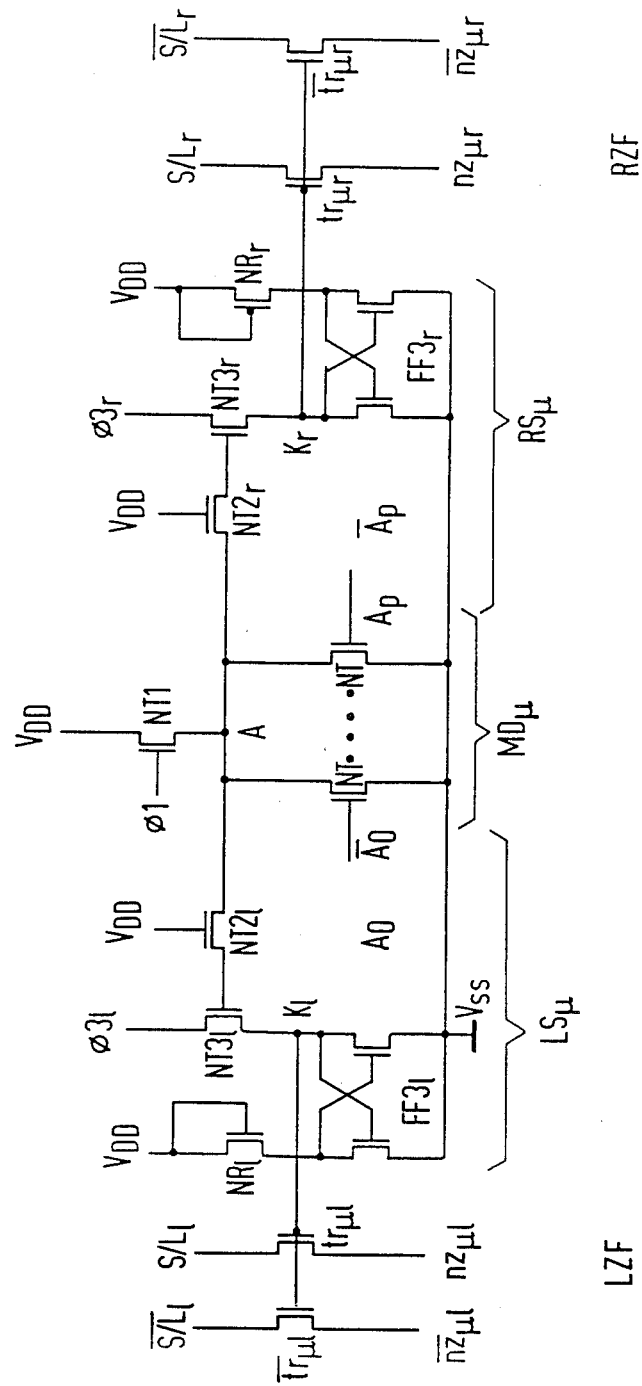

The construction and method of operation of the invention, however, together with additional objects and advantages thereof will be best understood from the following description of specific embodiments when read in connection with the accompanying drawings, in which:

FIG. 1 shows the redundancy principle according to the state of the art,

FIG. 2 shows the wiring of redundancy decoders according to the invention, with the associated write/read lines of the redundant rows and the generation of corresponding clock signals, using logic symbols, FIG. 2a shows the interlinkage of a circuit part according to the invention for selecting a redundant row with a circuit part for selecting a row provided for normal operation, in each case shown by logic symbols, FIG. 3 shows the realization of the circuit according to FIG. 2 by means of MOS transistors, FIG. 3a shows the generation, according to the invention, of an activating signal $\phi 3R$, FIG. 3b shows the generation, according to the invention, of an activation signal $\phi 3$, and an advantageous method of its wiring to a normal decoder, FIG. 3c shows a timing diagram of the clock signals used, FIG. 4a shows a schematic view of a known write/read memory with a center decoder, FIG. 4b shows a schematic view of a write/read memory according to the invention, with a center decoder and a redundant memory region, and FIG. 5 shows a wiring diagram for an embodiment, according to the and invention, of center decoders and switches.

Regarding the reference symbols, the following convention is adopted:

the subscript "$\mu$" used has a range of values from 1 to m (m equals total number of rows provided for normal operation), the subscript "$\nu$", a range of values from 1 to n (n equals total number of the replacement rows provided for the redundancy case);

"l" is used for designations which concern a left-hand cell field half,

"r" correspondingly for a right-hand cell field half,

"p" stands for the total number of parts of address lines (excluding complementary address lines).

In FIG. 1, the customary addressing principle of a known write/read memory, for instance by means of row lines, is shown. The normal decoders $ND_1$, $ND_2$, . . . serve for addressing the normal rows $nz_1$, $nz_2$, . . . , assigned to normal operation, while the decoders $RD_1$, $RD_2$, besides possible further decoders, are provided as redundancy decoders for addressing redundant rows $ez_1$, $ez_2$ etc. provided in the matrix. It can be seen from FIG. 1, that each normal decoder $ND_1$, $ND_2$ etc. is acted upon at each input by address lines consisting of mutually inverted pairs, so that always one of the address lines $A_o$ or $\overline{A_o}$, $A_1$ or $\overline{A_1}$ etc. is connected to a decoder $Nd_1$, $ND_2$. The redundancy decoders $RD_1$, $RD_2$ etc. which are assigned to a respective redundant row $ez_1$, $ez_2$ etc. (or column, respectively) and are also realized by a NOR gate each, and are controlled by the address lines $A_o$, $\overline{A_o}$ to $A_p$, $\overline{A_p}$ basically provided for normal operation in such a manner that the individual redundancy decoder is addressed by all address lines as well as by all address lines inverted thereto (that is, $A_o$, $\overline{A_o}$, $A_1$, $\overline{A_1}$, etc.). If now separable connections F (fuses) between one of the provided redundancy decoders $RD_1$, $RD_2$ etc. and the corresponding address lines $A_o$ or $\overline{A_o}$, $A_1$ or $\overline{A_1}$ etc. are cut open and the remaining connections of the address lines to the respective redundancy decoder are retained, the connection of this redundancy decoder to the totality of the provided row address lines $A_o$ to $\overline{A}_p$ agrees with the connection of exactly a single normal decoder $ND_1$, $ND_2$ etc. provided for normal operation, so that both decoders respond to the same address combination.

However, due to the mentioned permanent change, only the redundancy decoder activated by this change will respond. For this reason, the outputs of all identical redundancy decoder NOR gates $RD_1$, $RD_2$ etc. are connected to one input each of a common further NOR gate N, the output of which is connected via an inverter I to one further input each of all address decoders $ND_1$, $ND_2$ etc. provided for normal operation. If now one of the redundancy decoders $RD_1$, $RD_2$ . . . is activated and thereby, acted upon by the address pulses present at the address lines $A_o$, $\overline{A_o}$, . . . , $A_p$, $\overline{A_p}$, in such a manner that to each input of the NOR gate $RD_1$, or $RD_2$ forming the redundancy decoder a logic "0" is applied, then the corresponding redundant row is activated due to the logical "1" therefore present at the output of the inverter I. However, this "1" leads to the situation that a "1" cannot be possible at any output of the normal decoders $ND_1$, $ND_2$ etc. provided for normal operation, because a "1" at any one of the inputs of the normal decoders $ND_1$, $ND_2$ etc. formed by NOR gates prevents a "1" from being generated at the output of these decoders and therefore, presents activation of the corresponding row lines from taking place.

The matrix is addressed with respect to the column lines, in an analogous manner, using other address lines and decoders.

If, in a design of the addressing scheme corresponding to FIG. 1, a previously programmed redundancy decoder $RD_1$, $RD_2$ . . . (due to the permanent change) is addressed by a corresponding address combination, a blocking signal SS=high (=logical "1" is generated by this selected redundancy decoder $RD_1$, $RD_2$ . . . This blocking signal is applied, additionally to an input address, specially provided for this purpose of each normal decoder $ND_1$, $ND_2$ etc., so that the normal decoder selected by the applied address combination is blocked or inhibited. On the other hand, the addressed redundancy decoder activates the matrix row or matrix column which is respectively assigned to it and serves as a replacement.

In a write/read memory according to the invention, each of the row redundancy decoders $RD_v$ (or column redundancy decoders, respectively) contains according to FIG. 2 a NOR gate, having respective inputs connected to everyone of the row address line $A_O$, $\overline{A_O}$ . . . $A_p$, $\overline{A_p}$ (or column address lines, respectively) wherein the connection F between the individual input and the address line respectively controlling it is made disconnectible. In FIG. 2 is shown a redundancy decoder $RD_v$ assigned to a first redundant row $ez_v$ or $\overline{ez_v}$, respectively, and a redundancy decoder $RD_{V+1}$ assigned to a further redundant row $ez_{v+1}$ and $\overline{ez_{v+1}}$. For reasons of clarity, the presentation is limited to only two redundancy decoders and in the description, only the reference symbols of one of these decoders are given. With each of the redundancy decoders $RD_v$ are associated two AND gates $U_v$ and $U_v^*$ each of which have two signal inputs. The one of these two signal inputs of both AND gates $U_v$, $U_v^*$ is commonly connected to the output of the NOR gate representing the corresponding redundancy decoder $RD_v$. The output of each individual AND gate $U_v$ is connected to one input each of an OR gate OG common to all redundancy decoders, while the other signal input of all AND gates $U_v$ is controlled by a common clock signal $\phi 2$. The other input of each AND gate $U_v^*$ is controlled by a common activating signal $\phi 3R$. The output of each AND gate $U_v^*$ enables or inhibits a connection, provided by each of the transfer transistors $Tr_v$ and $\overline{Tr_v}$ between the respective row lines $ez_v$, $\overline{ez_v}$ (or column lines, respectively) between the respective row redundancy decoder column redundancy decoder, respectively) and a data input or data output S/L or $\overline{S}$/ common to the row or column.

The generation of the clock signal $\phi 2$ or the activating signal $\phi 3R$ (R=redundancy) is accomplished, for instance, in the manner shown in FIG. 2 in that a clock signal $\phi 1$ jointly provided for the operation of all redundancy decoders $RD_v$ of the memory circuit serves, via a chain of three idential and series-connected inverters I for generating the clock signal $\phi 2$ commonly provided for controlling the AND gates $U_v$. For the purpose of generating the activating signal $\phi 3R$ required for commonly controlling the AND gate $U_{v^*}$ the clock signal $\phi 2$ obtained in the manner just described is delayed via the series circuit of two further inverters I.

In FIG. 2a, the interaction between the individual redundancy decoders $RD_v$ and the normal decoders $ND_u$ is shown. A randomly chosen redundancy decoder $RD_v$ and a randomly chosen normal decoder $ND_u$ are shown. The OR gate OG which is also shown in FIG. 2 and is addressed on the input side via the AND gates $U_v$ by the totality of the redundancy decoders $RD_v$ is connected with its output signal $\phi k$, called inhibit signal $\phi k$, via an inversion to the one input of an AND gate U, having another input to which the clock signal $\phi 2$ is connected. The output of this AND gate U which is assigned, like the OR gate OG jointly to all row redundancy decoders $RD_v$, controls the one input of all the m AND gates $U_u+$ each having two inputs, and of which the other input is connected to the output of the normal address decoder $ND_\mu$, respectively assigned to the AND gate $U_\mu+$. To each of the m normal decoders $ND_\mu$ provided for normal operation is therefore assigned one each of these AND gates $U_\mu+$ which corresponds to the AND gate $U_v^*$ of the individual redundancy decoders $RD_v$ as shown in FIG. 2a. It is therefore controlled at its other input by an activating signal $\phi 3$ corresponding to the activating signal $\phi 3R$. This activating signal $\phi 3$ is furnished by the output of the AND gate U**. However, each AND gate $U_\mu+$ responds only if at the output of the NOR gate representing the normal decoder $ND_u$ a "1" is present, i.e. if a "1" is not present at any one of the address inputs of the normal decoder $ND_\mu$. The output of the AND gate $U_\mu+$ controls transfer transistors $Tr_\mu$ and $\overline{Tr_\mu}$ which belong to the corresponding rows $nz_\mu$ and $\overline{nz_\mu}$ which are provided for normal operation, and which form the release of a connection between these rows $nz_\mu$ and $\overline{nz_\mu}$ and a data input or data output S/L, $\overline{S}$/ within the memory matrix.

With regard to the operation of the circuit shown in FIGS. 2 and 2a according to the invention, the following can now be said: Since the circuit shown in FIG. 2a for the normal decoder $ND_\mu$ is generally used in clocked write/read memories and accordingly, the AND gate $U_\mu+$ is as a rule provided for the purpose of connecting the selected rows $nz_\mu$ and $\overline{nz_\mu}$ to the data inputs and outputs SL and $\overline{S}$/ as well as an activating signal $\phi 3$, the line which can be connected in FIG. 1 from the inverter I to one each input of the normal decoders $ND_\mu$ and carries the signal SS and the input of the existing normal decoder $ND_\mu$ which can be addressed by this line are saved, which means the saving of an input transistor per normal decoder $ND_\mu$ as compared to the conventional design, and therefore faster response. Saving an input transistor per normal decoder $ND_\mu$ further makes possible the saving of area as well as a shortening of the propagation time.

The operation of the design shown in FIG. 3 for the individual redundancy decoders $RD_v$ in MOS technology is substantially the same as that of a redundancy decoder $RD_v$ according to FIG. 2. However, it is still better adapted to the operation of a dynamic memory. It is preferably realized, like the circuit parts supplementing the design shown in FIGS. 3a and 3b, in n-channel MOS technology, which is also true especially if also the remaining parts of the memory are fabricated in this technology.

As can be seen in the redundancy decoders $RD_v$ and $RD_{v+1}$ shown in FIG. 3, there is assigned to each row address line $A_O$, $\overline{A_O}$, . . . $A_p$, $\overline{A_p}$ a transistor T, the gate of which forms a signal input each of the NOR gate contained in the respective redundancy decoder $RD_v$. The source terminals of these transistors T are connected together to a reference potential $V_{ss}$, while their drain terminals together form the output A of the NOR gate and are in addition connected via the source-drain path of a load transistor T1 controlled by a clock signal $\phi 1$, to a supply terminal providing a supply potential $V_{DD}$. The output A of the NOR gate contained in the respective redundancy decoder $RD_v$ is connected, by means of the source-drain path of a further transistor T2, to a node B which forms the actual output of the respective redundancy decoder $RD_v$ and accordingly serves for controlling the transfer transistors $Tr_v$ and $\overline{Tr_v}$ in a manner yet to be described, where by this control, the redundant row lines $ez_v$ and $\overline{ezHD}$ v assigned to the respective redundancy decoder $RD_\nu$ are connected to the data input or output S/L and $\overline{S}/$.

For generating the inhibit signal $\phi k$ seen in FIG. 2 or 2a, respectively, which is supplied by the OR gate OG, there is arranged, in the case of the redundancy decoder $RD_\nu$, according to FIG. 3, in each of the provided redundancy decoders $RD_\nu$, a further MOS field-effect transistor T3, the drain terminal of which is acted upon by the clock signal $\phi 2$, the gate of which is connected to the output B of the associated redundancy decoder $RD_\nu$, and the source terminal of which is connected via the one branch of a first RS-flipflop FF1 to reference potential $V_{SS}$. The AND gate $U_\nu$ in FIG. 2 or 2a, controlled by the clock signal $\phi 2$, corresponds in FIG. 3 to t electrical connection of the source terminal of the respective transistor T3 to the drain of a first transistor and the gate of a second transistor which form the mentioned RS-flipflop FF1. The two transistors forming the RS-flipflop FF1 are cross-coupled in a manner known per se and their source terminals are jointly connected to reference potential $V_{SS}$. Due to the mentioned connection of the transistor T3 to the one node of the RS-flipflop FF1, while the second node thereof is connected, via a load transistor R, connected as a resistor, to the terminal for the supply potential $V_{DD}$, the latter is enabled to make available the inhibit signal $\phi k$ required by the respective redundancy decoder $RD_\nu$ for influencing a normal decoder $ND_\mu$ to be replaced by it. This inhibit signal $\phi k$ is furnished in each case by the node formed by the source of the transistor T3 and the points of the RS-flipflop FF1 and is thereby connected to a further node C which is common to all redundancy decoders $RD_\nu$ and the function of which corresponds to that of the OR gate OG in FIGS. 2 and 2a.

A further RS-flipflop FF2 is likewise connected to the source terminals of its two cross-coupled transistors to reference potential $V_{SS}$ and, with its one node, via a further transistor R connected as a resistor, to supply potential $V_{DD}$. The other node of this RS-flipflop FF2 is connected to the source terminal of a transistor T4 corresponding to the transistor T3. This transistor T4 is controlled at its drain by the clock signal $\phi 3R$ and at its gate by the node B of the corresponding redundancy decoder $RD_\nu$. The node formed at the source terminal of the transistor T4 is in turn connected to the gates of the corresponding transfer transistors $Tr_\nu$ and $\overline{Tr}_\nu$, whereby the mentioned control of these two transfer transistors is effected.

Therefore, as can be seen from FIG. 3, an explicit realization of the OR gate OG in FIG. 2 can be dispensed within the design of the redundancy decoder $RD_\nu$ shown there, since the node C which is acted upon by the combinations of transistor T3 and RS-flipflop FF1 of the redundancy decoders $RD_\nu$ furnishing the inhibit signal $\phi k$ obviously corresponds in its behavior to the output of the OR gate OG. It should further be mentioned that the transistors used in the circuit according to FIG. 3 and likewise also in FIGS. 3a and 3b, are all of the self-blocking type and of the same channel type, particularly of the n-channel type.

In FIG. 3a an MOS circuit is shown which serves for generating the activating signal $\phi 3R$ required for addressing the drain terminal of the transistor T4 in FIG. 3 in the provided redundancy decoders $RD_\nu$, and is adapted to the embodiment of the redundancy decoders according to FIG. 3. The clock signal $\phi 1$ required for addressing them is also provided for the normal operation of the memory. However, a signal can also be used that is generated especially for this purpose by means of a clock generator. It is required of the clock signal $\phi 1$ that it goes to a logical "0" before addresses arrive via address line $A_O \ldots \overline{A_p}$ to the normal decoders $ND_\mu$ and to the redundancy decoders $RD_\nu$ and before the clock signal $\phi 2$ switches to a logical "1".

The behavior of the clock signal $\phi 1$ in time with respect to the signals at the address lines $A_O$ to $A_p$ and $\overline{A_O}$ to $\overline{A_p}$ can be seen from the timing diagram according to FIG. 3c. The rising edge of the signals at the address lines $A_O, \overline{A_O}, \ldots, A_p, \overline{A_p}$ is delayed in time relative to the falling edge of the clock signal $\phi 1$, while the rising edge of the clock signal $\phi 2$ leads in time the rising edge of the activating signals $\phi 3$ and $\phi 3R$, the rising of which can arrive simultaneously.

In the circuit shown in FIG. 3a for generating the activating signal $\phi 3R$, two transistors 1 and 2 together form a first inverter, in which the switching transistor 1 controlled by the clock signal $\phi 1$ is connected with its source terminal to the reference potential $V_{ss}$ and with its drain, on the one hand, via the load transistor 2 controlled by the clock signal $\phi 2$ to the supply potential $V_{DD}$ and, on the other hand, forms with its source together with the drain of the transistor 1, the signal output of the first inverter. This signal output controls the switching transistor 3 of a second inverter, the load transistor 4 of which is controlled by the clock signal $\phi 1$. With respect to connecting to the reference potential $V_{ss}$ and the supply potential $V_{DD}$, the second inverter 3, 4 corresponds completely to the first inverter 1, 2. The output of this inverter which is formed by a circuit point between the two transistors 3 and 4 of the second inverter is connected (a), via a transfer transistor 5 controlled by the clock signal $\phi 2$ to the source of a transistor 12 controlled by the clock signal $\phi 1$, the drain of which is connected to supply potential $V_{DD}$, and in addition, (b), by means of the just mentioned transfer transistor 5, to the gate of a further MOS field-effect transistor 6, the drain of which is acted upon by the clock signal $\phi 2$.

The last-mentioned transistor 6 is connected with its source terminal, on one hand, via the source-drain path of a transistor 10 controlled by the clock signal $\phi 1$, to the reference potential $V_{ss}$ and in addition to the gates of two further transistors 7 and 8, the drain terminals of which are connected to a supply potential $V_{DD}$. In the case of transistor 7, it should be noted here that its gate is connected via a capacitor C to its own source terminal. In addition, the source terminal of this transistor 7 is connected via the drain-source path of a further transistor 9 to reference potential $V_{ss}$. In addition, transistor 9 is controlled here at its gate from the output of the second inverter formed by the two transistors 3 and 4 in a manner already described. The last-mentioned measure applies also to a further transistor 11, the source of which is connected to reference potential $V_{ss}$ and the drain of which is connected via the already described transistor 8 to supply potential $V_{DD}$. The clock signal $\phi 3R$ to be generated can be taken off at a point of the circuit between the two last-mentioned transistors 8 and 11.

The circuit for generating the activating signal $\phi 3$ required for the normal decoder $ND_\mu$ is shown in combination with the circuit of any normal decoder $ND_\mu$ in FIG. 3b which will now be described.

A first inverter which consists of the two transistors 14 and 15 and is connected with its switching transistor 14 to reference potential $V_{ss}$, and with its load transistor 15 to the supply potential $V_{DD}$s controlled by the clock signal $\phi 1$ with respect to its switching transistor 14 and by the clock signal $\phi 2$ with respect to its load transistor 15. The output of the first inverter provided by a circuit point between the latter two transistors 14 and 15 controls the gate of the switching transistor 16 of a further inverter. The switching transistor 16 is tied with its source terminal likewise to reference potential $V_{ss}$ and with its drain, to the source terminal of the load transistor 17 of the second inverter which forms the connection to the supply potential $V_{DD}$ and is controlled by the clock signal $\phi 1$. Similar to FIG. 3a, the inverter output realized by a circuit point between transistors 16 and 17 is connected to a transfer transistor 18, the gate of which is controlled by the clock signal $\phi 2$. The current-carrying terminal facing away from the second inverter 16, 17, of the transfer transistor 18 is connected, on the one hand, to reference potential $V_{ss}$ via a transistor 20 controlled by an inhibit signal $\phi k$ which is supplied according to FIG. 3 by the redundancy decoders $RD_v$. On the other hand, it is connected to the gate of a transistor 19, the drain of which is acted upon by the clock signal $\phi 2$.

With its source, the last-mentioned transistor 19 is connected, via the parallel circuit of two further transistors 21 and 22, to reference potential $V_{ss}$, the gate of transistor 21 being acted upon by the inhibit signal $\phi k$ supplied by the redundancy decoders $RD_v$ and the gate of the other transistor 22 being acted upon by the clock signal $\phi 1$. Furthermore, a node which is connected to the gate of two further transistors 23 and 24 as well as to one pole of a capacitor C* is provided by the source of the transistor 19. The other pole of the capacitor C* is connected to the source terminal of transistor 23. The drain terminals of transistors 23 and 24 are connected to supply potential $V_{DD}$ and their source terminals to reference potential $V_{ss}$ via transistors 25 and 26, respectively, controlled by the output of the second inverter 16, 17. The transistor 26 which forms the connection between the transistor 24 and reference potential $V_{ss}$ is shunted by the source-drain path of a transistor 27 controlled by the inhibit signal $\phi k$. The activating signal $\phi 3$ which is required for acting on the normal decoder $ND_\mu$ is furnished by a node between the transistors 24, 26 and 27.

The normal decoders $ND_\mu$ are designed in the manner which can likewise be seen in FIG. 3b. A number p of MOS field-effect transistors NT connected via a common load transistor NT1 to supply potential $V_{DD}$ form the NOR gate which is contained in the normal decoder $ND_\mu$. To the gate of each of these transistors NT is assigned an address input $A_O$ or $\overline{A_O}, \ldots A_p$ or $A_p$ provided for activating the normal decoder $ND_u$. The output A' of the NOR gate, i.e., the node between the drains of the parallel-transistors NT and the source of the load transistor NT1 controlled by the clock signal $\Phi 1$, is again connected to a transfer transistor NT2, the gate of which is connected to supply potential $V_{DD}$ and the other terminal of which leads to the gate of a further transistor NT3. The drain terminal of the transition NT3 is acted upon by the activating signal $\Phi 3$ and is therefore connected to the drain of the transistors 26 and 27 as well as to the source of transistor 24. The source terminal of transistor NT3 is connected to a node of an RS-Flipflop FF3, the base points of which are at reference potential $V_{ss}$ and the second node of which is connected to supply potential $V_{DD}$ via a load transistor NR connected as a resistor to supply potential $V_{DD}$.

The RS-flip-flops FF1 and FF2 (FIG. 3) in the individual redundancy decoders $RD_v$ and the RS-flipflop FF3 (FIG. 3b) in the individual normal decoders $ND_\mu$ serve for the protection of the circuit and could be replaced in principle also by other circuits customary for this purpose. The transistor NT3 acted upon at its drain by the activating signal $\phi 3$ forms, with its source terminal connected to the RS-flipflop FF3, the output of the normal decoder $ND_\mu$ which is connected to the gates of the transfer transistors $Tr_\mu$ and $\overline{Tr}_\mu$ which in turn form the connection of the rows $nz_\mu$ and $nz_\mu$ (or columns, respectively) and are provided for normal operation to the corresponding date input or data output S/L or $\overline{S}/$.

The following behavior of the circuit according to the invention can now be shown in connection with FIGS. 3, 3a, 3b and 3c: By severing the connections F, for instance, by means of laser beams (i.e. by a permanent change at any desired redundancy decoder $RD_v$), either the self-locking transistor T for the address line $A_i$ or the self-locking transistor T for the address line $\overline{A_i}$ can be disconnected from the decoder node A for each redundancy row $ez_v$ (we always have: $1 \leq i \leq p$) and thus, programming of one or several redundancy decoders $RD_v$ can be achieved. The case will now be considered that both redundancy decoders $RD_v$ and $RD_{v+1}$ in FIG. 3 are activated and programmed. In addition it is assumed that the redundancy decoder $RD_v$ is selected by a suitable address combination. This means that all address lines still connected to the redundancy decoder $RD_v$ are tied to "low" (=logical "0") after the appropriate connections F are severed. Thereby, the pre-charge of the node A, generated by the clock signal $\phi 1$, between the switching transistors T and the load transistor T1 of the NOR gate contained in the respective redundancy decoder $RD_v$ is preserved. The redundancy decoder $RD_v$ is thereby activated. At the same time, however, also a decoder provided for normal operation, for instance the decoder $ND_\mu$ shown in FIG. 3b is activated. In accordance with the clock schematic shown in FIG. 3c there appears in time, after the occurrence of the addressing signal $A_i$ or $\overline{A_i}$, respectively, and therefore, of the activation of the redundancy decoder $RD_v$ (FIG. 3) and of the normal decoder $ND_\mu$ (FIG. 3b) the rising edge of the clock signal $\phi 2$ and charges, via the transistor T3, the node C furnishing the inhibit signal $\phi k$ (FIG. 3) to "high" (=logical "1"). By the output which is charged to "high" after the clock signal $\phi 2$ and furnishes the activating signal $\phi 3R$, of the circuit shown in FIG. 3a, the redundant row $ez_v$ or $\overline{ez}_v$ is selected. By the rising edge of the inhibit signal $\phi k$, a rising edge of the activating signal $\phi 3$ to be generated by the circuit according to FIG. 3b is inhibited and the decoder $ND_\mu$ provided for normal operation cannot be selected in spite of the presence of an address (for instance of the normal decoder $ND_\mu$ shown in FIG. 3b).

The advantages of the redundancy concept according to the invention are that less space is required than in the customary solution, since the regular decoders $ND_\mu$ are not changed by inserting the redundancy (signal SS in FIG. 1; saving an input per normal decoder $ND_\mu$). In addition, a saving of time as compared to the redundancy concept shown in FIG. 1 is achieved in an advantageous manner because, by suitable design of the dimensions of the advantageous circuits shown in FIGS. 3, 3a, 3b and also in FIGS. 2 and 2a it is assured that the activating signal $\phi 3$ remains deactivated also if the inhibit signal $\phi k$ goes to "high" only after a delay of approximately 1 ns relative to the rising edge of the clock signal $\phi 2$.

The proposed redundancy concept can be used, according to the invention, also if so-called center decoders are used as the addressing decoders for addressing the memory cells. This concerns cell-field arrangements which are divided into a left and a right cell-field half, in which the address decoder selects simultaneously two pairs of bit lines. One bit-line pair is physically arranged on the one side (left cell-field half) and the other on the other side (right cell-field half) of the center decoder. This means that the center decoder is responsible at the same time for addressing the corresponding rows in both halves of the entire cell field. The lines can also be designed, for instance, as "folded" bit lines.

The corresponding known space allotment diagram is shown in FIG. 4a. There, the cell field is subdivided into a left half LZF and a right half RZF, between which a row of the mentioned center decoders $MD_\mu$ extends. The center decoders $MD_\mu$ must act, as already noted, onto the left cell-field half LZF as well as on the right cell-field half RZF so that for each center decoder $MD_\mu$ a left "switch" $LS_\mu$ for addressing in the left cell-field half LZF as well as a right "switch" $RS_\mu$ for addressing in the right cell-field half RZF is provided. If now redundancy and a design according to the present invention are to be provided, it is advisable to use for the redundancy row halves arranged to the left and to the right, $ez_\nu$, $ez_{\nu r}$ one each of the already described redundacy decoders $RD_\nu$ as is shown in FIG. 4b as the redundancy decoder $RD_{\nu r}$.

In a design, according to the invention, of the memory region provided for normal operation, according to FIG. 4b which contains the two cell-field halves LZF, RZF with normal rows $nz_\mu$ (subdivided into a left ($nz_{\mu l}$) and a right normal row half ($nz_{\mu r}$) as well as a center decoder $MD_\mu$ per normal row $nz_u$, a center decoder $MD_\mu$ and the two switches $LS_\mu$, $RS_\mu$ it is of advantage due to the design, yet to be described, of the center decoders $MD_u$ together with the corresponding switches $LS_\mu$, $RS_\mu$ in connection with the use of two redundancy decoders $RD_{\nu 1}$, $RD_{\nu r}$ of a redundant row $ez_{\nu 1}+ez_{\nu r}$ that in the redundancy case, not a complete normal row $nz_u$, but only the defective row half ($nz_{\mu 1}$, $nz_{\mu r}$) need to be replaced in the left or right cell-field half LZF, RZF by a corresponding left ($ez_{\nu l}$) or right ($ez_{\nu r}$) half of a redundant line $ez_{\nu l}+ez_{\nu r}$. Thereby assumed uniform distribution of defects in normal rows $nz_\mu$ over the two cell-field halves LZF, RZF, the number of defects "healable" by the redundancy concept according to the invention can be doubled over known redundancy concepts with the same number of available redundant rows $ez_{\nu l}+ez_{\nu r}$.

In a write/read memory according to the invention as per FIG. 4b, the left and right switches $LS_\mu$, $RS_\mu$, which are located between the center decoders $MD_\mu$ and the left or right cell-field half LZF, RZF are activated by an activating signal $\phi 3_l$ and $\phi 3_r$, respectively. The purpose and design of the two circuits which are not shown in the figures and generate the activating signals $\phi 3_l$, $\phi 3_r$ are generated analogously to the already described circuit section in FIG. 3b, which generates there the activating signal $\phi 3$. A corresponding logic diagram is contained in FIG. 2a. In lieu of the inhibit signal $\phi k$ used there, however, an inhibit signal $\phi k_l$ is used for suppressing the activating signal $\phi 3_l$ (l=responsible for the left cell-field half LZF). Analogously thereto, an inhibit signal $\phi k$ is used for suppressing the activating signal $\phi 3_r$. Both inhibit signals $\phi k_l$, $\phi k_r$ are generated, analogously to the circuit according to FIG. 3, in the redundancy decoders $RD_{\nu l}$ and $RD_{\nu r}$, respectively. Both redundancy decoders $RD_{\nu l}$, $RD_{\nu r}$ are identical circuitwise with the redundancy decoders $RD_\nu$ known from FIG. 3.

According to FIG. 5, each center decoder $MD_u$ assigned to one row $nz_u$ of the cell field provided for normal operation and subdivided into the two halves LZF and RZF corresponds functionally and circuitwise to the NOR gate known from FIG. 3b together with the corresponding load transistor NT1 of a normal decoder $ND_\mu$. The center decoder $MD_u$ is followed to the left by the left switch $LS_u$ and to the right by the right switch $RS_\mu$. The connection is made via respective transfer transistors $NT2_l$, $NT2_r$, the gate of each transfer transistor $NT2_l$, $NT2_r$ being connected to the supply potential $V_{DD}$.

Functionally, the two transfer transistors $NT2_l$ and $NT2_r$ correspond to the transfer transistor NT2 known from FIG. 3. The transfer transistor $NT2_l$ is connected at its current-carrying lead facing away from the center decoder $MD_u$ to the gate of a transistor $NT3_l$, and the transfer transistor $NT2_r$ is connected similarly to the gate of a transistor $NT3_r$. The two transistors $NT3_l$ and $NT3_r$ correspond to the transistor $NT3$ of the normal decoder $ND_u$ shown in FIG. 3b and are accordingly acted upon at their drain terminals by an activating signal $\phi 3_l$ and $\phi 3_r$, respectively, corresponding to the activating signal $\phi 3$, its generation having been described before. Likewise, the RS-flipflop FF3 known from FIG. 3b is represented twice, once in the form of the RS-flipflop $FF3_l$ and the RS-flipflop $FF3_r$, the RS-flipflop $FF3_l$ being contained in the left switch $LS_\mu$ and the RS-flipflop $FF3_r$ in the right switch $RS_\mu$. Further factual discussions regarding the embodiment of the center decoder $MD_u$ shown in FIG. 5 and of the two switches $LS_\mu$, $RS_\mu$ together with their connection to the cell half $nz_{\mu l}$ and $nz_{\mu r}$ located in the left and right cell-field half LZF and RZF, respectively, and provided for the normal operation may not be required any longer due to the comments made in connection with FIG. 3b. The invention can be applied to static as well as dynamic write/read memories, the storage cells of which are constructed as single-transistor storage cells.

The foregoing is a description corresponding in substance to German Application No. P 34 28 552.0, dated Aug. 2, 1984, the International Priority of which is being claimed for the instant application, and which is hereby made part of this application. Any material discrepancies between the foregoing specification and the aforementioned corresponding German application are to be resolved in favor of the latter.

We claim:

1. Integrated write/read memory comprising storage cells arranged in matrix-fashion in columns and rows, normal address decoders for addressing the storage cells respectively assigned to a column or row, a predetermined number of normal columns and normal rows being provided for normal operation and a remaining number of replacement columns and replacement rows being provided as replacement for a respective column or row of the columns or rows provided for normal operation, redundant address decoders assigned to the respective replacement columns and replacement rows, means for adapting the redundant decoders to normal decoders provided for normal operation including a severable connection providing that addressing each of the replacement columns and replacement rows is possible only after a permanent change which includes severing said severable connection at the redundant decoder respectively assigned to the respective replacement column and replacement row, and means for deactivating the normal decoder assigned to the respective normal columns or normal rows; normal decoder selecting means for selecting the normal decoders assigned to the respective normal columns or normal rows such that a selection of one of the normal decoders is accomplished only, if the redundant decoder is not addressed simultaneously by an appropriate combination of address lines and a first activating signal common to all normal decoders; redundant decoder selecting means for selection of redundant decoders for replacing one of the respective normal columns or normal rows on condition that a combination of an address signal on the address lines for the respective normal decoder to be replaced, and a second activating signal common to all redundant decoders is produced; and an inhibit signal being generated in response to the severing of said severable connection of at least one of said respective redundant decoders for inhibiting the signal change required for the normal decoder of said first activation signal, including at least one NOR-gate associated with each of the normal decoders and each of the redundant decoders, said address line signal for the normal decoder forming signal inputs for the respective NOR gates; said address line signal for the redundant decoder form signal inputs for the respective NOR gate of the redundant decoders which are connected to the respective address line via said severable connection; the outputs of the NOR gates of the normal decoders being provided for controlling a respective first AND gate; the outputs of the NOR gates of the redundant decoders being provided for controlling a respective second AND gate; the first and second AND gates simultaneously being controlled by a respective one of said first and second activating signals for releasing a connection between a respective data input or data output and of the rows or columns belonging to the respective normal decoder or redundant decoder being releasable by said first and second AND-gates; a third AND-gate being controlled by the NOR gate of each individual redundant decoder together with a common clock signal being common to all redundant decoders, the output signal of which includes said inhibit signal, which controls the first activating signal required for the release of the connection between the data input and the data output and the columns or rows respectively associated with the normal decoders for deactivation of the first activating signal.

2. Write/read memory according to claim 1, including two signal inputs for addressing the first, second and third AND gates provided in the normal decoders and in the redundant decoders, the first signal input being addressed by the output of the NOR gate being acted upon by the address line signal, the other input of the first and second AND gates of the normal decoders being addressed by the first activating signal common to all normal decoders, the redundant decoders being acted upon by the second activating signal common to all redundant decoders; the third AND gate provided for the individual redundant decoders being acted upon at its second input by the common clock signal; a signal being available at the output of the third AND gate, which is generated after the respective redundant decoder is programmed to a selected address, including a further OR gaate common to all redundant decoders being driven from the outputs of all third AND gates of the redundant decoders from the input side, whereby the inhibit signal is generated at the output of the further OR gate.

3. Write/read memory according to claim 2, including a further OR gate and an inverter through which the inhibit signal generated at the output of the further OR gate is fed through, a fourth AND gate having an input for receiving the inverter inhibit signal; another input of the fourth AND gate being driven by the common clock signal, whereby the first activation signal is generated at the output of said fourth AND gate which serves for activating the first AND gate and is common for all normal decoders.

4. Write/read memory according to claim 1, including a plurality of first transistors, being of the self-locking MOS-field effect type, each being assigned to a respective address input of the redundant decoders, which forms a switching transistor for the NOR gate of the respective redundant decoder, the drain of the self-locking MOS-field effect transistors being connected to one side of a disconnectible connection, the source terminal of a common load transistor being connected to the other side of the disconnectible connection and thereby to an output of the NOR gate formed by said self-locking transistors; a second transistor, being of the transfer type, receiving the output of the NOR-gate, being connected at its gate to the supply potential of the NOR gate; third and fourth transistors having gates being connected to said second transistor, respective first and second protective flip-flops connected to the source terminals of said third and fourth transistors, via the second transistor to the reference potential of the NOR gate, and the drain terminal of the fourth transistor, which is acted upon by the common second activating signal of the redundant decoder, and in the case of the third transistor by the first clock signal provided in common for the simultaneous control of the third AND gate in the redundant decoders, the source of the fourth transistor being acted upon at its drain by the second activating signal forming the release of the connection between the data input or the data output and the output of the respective redundant decoder, the third transistor which represents the third AND gate of the redundant decoder being controlled by the first clock signal serves to produce at its source terminal the inhibit signal causing the deactivation of the first activating signal after a corresponding redundant decoder is selected.

5. Write/read memory according to claim 4, wherein the first and second protective flip-flops are connected at one respective first node directly to the source terminal of the two respective first and second transistors each forming a respective AND gate with a respective protective flip-flop, the base points of each flip-flop being connected to reference potential for the NOR gate forming the redundant decoder, while a second node of each of the two protective flip-flops are connected to supply potential of the redundant decoder via an MOS field effect transistor connected as a resistor.

6. Write/read memory according to claim 1, wherein for generating the second activating signal serving jointly the redundant decoders, a circuit consisting of twelve self-blocking MOS-field effect transistors numbered one to twelve and a capacitor are provided as well as for their operation a first and another clock signals; the first numbered transistor is connected with its source to reference potential, with its gate to the first clock signal and with its drain to supply potential via a second numbered transistor controlled by the common clock signal as well as to the gate of a third numbered transistor; the third numbered transistor, together with a fourth numbered transistor forms a further series circuit located between the supply potential and reference potential, in which the fourth numbered transistor connected with its drain to the supply potential is controlled by the first clock signal; a circuit point located between the third and the fourth numbered transistor is connected via the source-drain path of a fifth numbered transistor the gate of which is controlled by the common clock signal to the gate of a sixth numbered transistor addressed at its drain by the common clock signal as well as via a twelfth numbered transistor which is controlled by the first clock signal to supply potential; the source terminal of the sixth numbered transistor is connected at the one side to the gate of a seventh numbered transistor, the drain of which is connected to supply potential, and the source of which is connected to its own gate via the capacitor and to the drain of a ninth numbered transistor, the source of which is connected to reference potential, and the gate of which is in turn connected to the circuit point between the third and fourth numbered transistor; the source terminal of the sixth numbered transistor is connected to the drain terminal of a tenth numbered transistor, which is controlled by the first clock signal and connected at its source to reference potential; the source terminal of the sixth numbered transistor is connected to the gate of an eighth numbered transistor, the drain of which is connected to supply potential and the source of which forms the output furnishing the second activating signal for the redundant decoder as well as, via a further eleventh numbered transistor to reference potential, where the gate of said eleventh numbered transistor is acted upon by the circuit point located between the third and the fourth transistor, and in which, finally, the first and the common clock signals are applied in such a manner that the falling edge of the first clock signal is located in time immediately before the appearance of the addressing signals, while the common clock signal is used for the corresponding control of the third AND gate in the individual redundant decoders.

7. Write/read memory according to claim 1, wherein the inhibit signal furnished by an activated redundant decoder, together with the first clock signal and the other clock signal is provided for controlling a circuit which furnishes the first activating signal for the normal decoders and is formed by self-blocking MOS-field-effect transistors numbered 14 to 27, including a further capacitor; the inhibit signal serving to suppress the generation of the first activating signal if, simultaneously with the addressing of the redundant decoder causing the generation of the inhibit signal, a normal decoder is being addressed.

8. Write/read memory according to claim 1, including a circuit formed by two self-locking MOS-field effect transistors numbered 14 and 27 of the same channel type; a first inverter, formed by a switching transistor being controlled by the first clock signal; a fifteenth load transistor being controlled by the common clock signal; a second inverter having a sixteenth switching transistor being controlled by said fifteenth load transistor, another load transistor of said second inverter being controlled at its gate by the first clock signal; a transfer transistor for receiving the output of the second inverter is connected, via the source-drain path of an seventeenth numbered transfer transistor controlled by the first clock signal is connected, at the one side, to the gate of an eighteenth numbered transistor which is driven at its drain by the first clock signal and is connected, at the other side, via the source-drain path of a nineteenth numbered discharge transistor controlled by the inhibit signal referenced to reference potential; the eighteenth numbered transistor driven at its gate by the output of the second inverter being connected with its source to the one side, via a parallel circuit consisting of a twentieth numbered transistor controlled by the inhibit signal, to a twentyfirst numbered transistor controlled by the first clock signal referenced to reference potential and to the other side, to the one terminal of the further capacitor as well as to the gates of charging twentysecond and twentythird numbered transistors which are connected with their respective drain to supply potential; the other terminal of the further capacitor being connected to the source of a twentyfourth numbered transistor connected with its drain to reference potential; said twentyfourth numbered transistor being controlled at its gate by the output of the second inverter; the source of the twentythird numbered charging transistor being connected via said parallel circuit consisting of two twentyfifth and twentysixth numbered transistors in series with the reference potential, wherein said twentysixth numbered transistor is controlled by the inhibit signal and the twentyfifth numbered transistor by the output of the second inverter; the first activating signal for the normal decoder being generated at a circuit point which is located between the drain terminals of said two twentyfifth and twentysixth numbered two transistors and the source terminal of the twentythird numbered charging transistor.

9. Write/read memory according to claim 1, including a circuit for obtaining the release of the connection between the data input and the data output, transfer transistors which when activated at their respective gates cause the release of the connection between the data input and data output, respectively, of the normal matrix rows provided for normal operation; a protective third flip-flop to which said switching transistor to the other side is connected to the drain of the first transistor of said protective third flip-flop containing two cross-coupled transistors and to the gate of the other transistor of said third protective flip-flop;

(e) wherein the other transistor of said third protective flip-flop is connected with its source terminal to the gate of the first transistor of the third protective flip-flop as well as, via the source-drain path of a load transistor to supply potential wherein the gate of this load transistor also is connected to supply potential, and (f) wherein the source terminals of the two transistors which form the third protective flip-flop, are connected to reference potential.

10. Write/read memory according to claim 1 comprising a subdivision of the normal matrix columns and rows provided for normal operation into a left and a right cell-field part including the corresponding normal decoders in the manner of center decoders which are connected with the left or right cell-field parts, respectively, via a left or right switch, respectively, wherein the left and right switches, respectively, are each addressed via a left or right activating signal, respectively, characterized thereby that the redundant matrix columns and rows provided as replacement are also subdivided into a left row half part and a right row half part; these row half parts being selected via a left or right redundant decoder of its own; and wherein the left or right activating signal is generated analogously with the first activating signal for normal decoders.

11. Write/read memory according to claim 10, wherein a corresponding left and right inhibit signal is used for generating the left or right activating signal which is generated analogously by the left or right redundant decoders to form the inhibit signal, which optionally suppresses the occurrence of the first activating signal in normal decoders.

12. Write/read memory according to claim 11, comprising:
   (a) a plurality of center decoders which each contain a corresponding plurality of NOR gates, each NOR gate which is realized in the form of p parallel-connected MOS transistors wherein p=number of pairs of address lines including their complementary address lines and wherein each gate of the MOS transistors is controlled by an addressing line or a complementary addressing line; wherein the source terminals of said MOS transistors are connected to reference potential and a circuit point, formed by the common connection of the drain terminals of all parallel-connected MOS transistors of the NOR gate, including a first clock signal, the source-drain path of the switching transistor being controlled by said first clock signal referenced to supply potential; and
   (b) switches disposed to the left or right of each center decoder, including a left and a right transverse transistor and respectively having its gate connected to supply potential and wherein source and drain, respectively, is connected at the one side, to a circuit point of the center decoder and, at the other side, connected to the gate terminal of a respective further left and right switching transistor, wherein the left or right activating signal is connected to the drain of said left and right switching transistor and wherein the source terminal forms a respective left or right circuit node which is connected, respectively, to the left or right cell-field half part at the gates of respective left and right pairs of transfer transistors which cause the release of the connection between the data input and the data output and of the respective left or right row half parts provided for normal operation; including further protective flip-flops and wherein said circuit node to the other side is connected to the respective third protective flip-flop, formed in the usual manner of two cross-coupled transistors in such a manner that said left and right circuit node, respectively, forms the drain terminal of cross-coupled transistors as well as also the gate terminal of the other cross-coupled transistor, and wherein the source terminals of said two transistors are connected to reference potential and the gate terminal of the one transistor as well as the drain terminal of the other transistor are connected to supply potential via a further respective load transistor connected as a resistor.

* * * * *